United States Patent [19]

Wills et al.

[11] Patent Number: 4,758,180
[45] Date of Patent: Jul. 19, 1988

[54] MULTIPLE SIZE CONNECTOR PANEL AND METHOD FOR CONSTRUCTING

[75] Inventors: David C. Wills; Jay D. Atkinson, both of Cambridge, Ohio

[73] Assignee: NCR Corporation, Dayton, Ohio

[21] Appl. No.: 861,219

[22] Filed: May 9, 1986

[51] Int. Cl.⁴ .......................... H02G 3/08; H05K 5/04
[52] U.S. Cl. ................................. 439/535; 174/65 R
[58] Field of Search .......... 339/122 R, 122 F, 103 R; 174/65 R; 439/527, 535, 536

[56] References Cited

U.S. PATENT DOCUMENTS

| | | |
|---|---|---|
| 769,646 | 9/1904 | Case . |
| 1,314,346 | 8/1919 | Meschenmoser ................... 439/535 |
| 1,646,622 | 10/1927 | Mason . |
| 1,920,811 | 8/1933 | Schwabacher ........................ 247/15 |
| 2,927,149 | 3/1960 | Kern, Jr. ............................ 174/65 R |
| 3,617,612 | 11/1971 | Patton ..................... 174/59 |
| 4,449,015 | 5/1984 | Hotchkiss et al. .................. 174/138 |
| 4,649,230 | 3/1987 | Nielsen ............................ 339/103 R |

*Primary Examiner*—Z. R. Bilinsky
*Attorney, Agent, or Firm*—Wilbert Hawk, Jr.; Albert L. Sessler, Jr.; Richard W. Lavin

[57] ABSTRACT

An electrical connector panel includes a two-piece knock-out plug having a raised portion formed in a configuration of a first electrical connector member and a portion flush with the surface of the panel member which when removed in conjunction with the removal of the raised portion provides an aperture which can accommodate a second electrical connector member having a size different from the first electrical connector member.

5 Claims, 3 Drawing Sheets

MULTIPLE SIZE CONNECTOR PANEL AND METHOD FOR CONSTRUCTING

BACKGROUND OF THE INVENTION

The present invention is directed to electrical outlet panels and more particularly to an electrical outlet panel which can accommodate different size electrical connectors in the same location.

In modern day point of sale systems which include a terminal device and associated peripheral devices such as remote displays, change dispensers, printers, etc., the peripheral devices are connected to the terminal device by electrical cables. The electrical cable terminates in an electrical connector which is secured to a connector panel attached to the terminal housing. The electrical connectors are mounted within apertures located in the connector panel. It has been found that after the terminal device has been in use, a need arises where additional peripheral devices are required to be added to the terminal device. In order to accommodate this situation, the connector panel has had to be modified by the customer to provide the additional apertures required to accommodate the number of peripherals that are to be added to the terminal device. The cost associated with doing this, aside from increasing the size of the panel, makes this a highly undesirable option. It would be more desirable to have a panel which can accommodate a number of different size electrical connectors within a small panel area.

Severable portions of a panel known as knock-out plugs or blanks have been used in electrical outlet boxes to accommodate only one electrical connector attached thereto. But in most prior instances, the knock-out plugs have been of a standard diameter to accommodate the electrical connector. An example of this type of construction may be found in U.S. Pat. No. 2,000,850, entitled "Outlet Box and Cable Clamp" by J. Knell. Where an electrical housing is required to accommodate several electrical connectors in the same opening, the opening in the wall of the housing has been constructed to contain a number of removable blocks which, when removed from the opening, provide for the mounting of a plurality of electrical cables within the opening. However the cables are mounted side-by-side which extends the size of the opening. An example of this type of construction may be found in U.S. Pat. No. 769,646 entitled "Connection Box" by F. E. Case.

It will be seen that the teachings of the prior art are unable to accommodate different size electrical connectors without increasing the size of the connector panel which adds a substantial cost to the terminal device.

SUMMARY OF THE INVENTION

The connector mounting device of the present invention comprises a two piece knock-out plug located in a sheet metal panel which provides two different size electrical connector openings depending on whether one or both sections of the plug are removed. In manufacturing the plug, the large and small sections of the plug are first punched from the surface of the panel after which the small section of the plug is stamped back flush with the surface of the panel leaving the large section in a punched or raised position. This stamping of the small section of the plug securely mounts the small section of the plug to the panel so as to provide a support for the mounting of the smaller size connector to the panel upon removal of the large section of the plug while allowing the small section to be subsequently removed to accommodate the larger size connector.

From the foregoing it can be seen that it is a primary object of the present invention to provide a connector panel capable of mounting different size electrical connectors in the same location of the panel.

It is another object of this invention to provide a knock-out plug which can accommodate different sizes of electrical connectors in a panel much smaller than would be required if separate knock-out plugs were provided for each possible connector size.

It is another object of this invention to provide a method for constructing a knock-out plug in a panel member for mounting a plurality of different size electrical connectors.

These and other objects of the present invention will become more apparent when taken in conjunction with the following description and drawings wherein like characters indicate like parts and which drawings form a part of the present application.

DESCRIPTION OF THE PREFERRED EMBODIMENT

Figure 1:
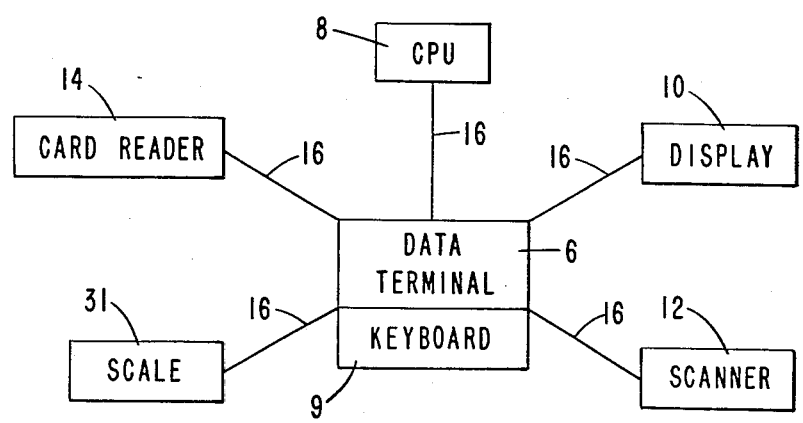
FIG. 1 is a schematic representation of a data processing system including a data terminal device.
Figure 2:
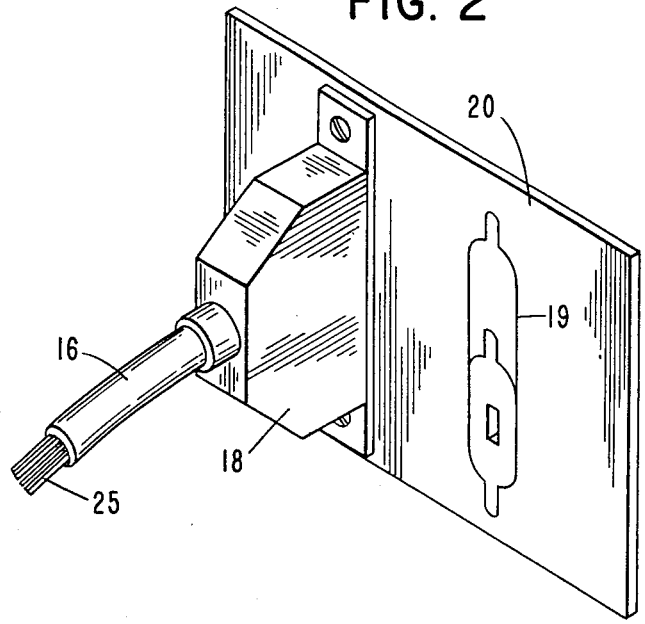
FIG. 2 is a perspective view of an electrical connector mounted to a connector panel.
Figure 3:
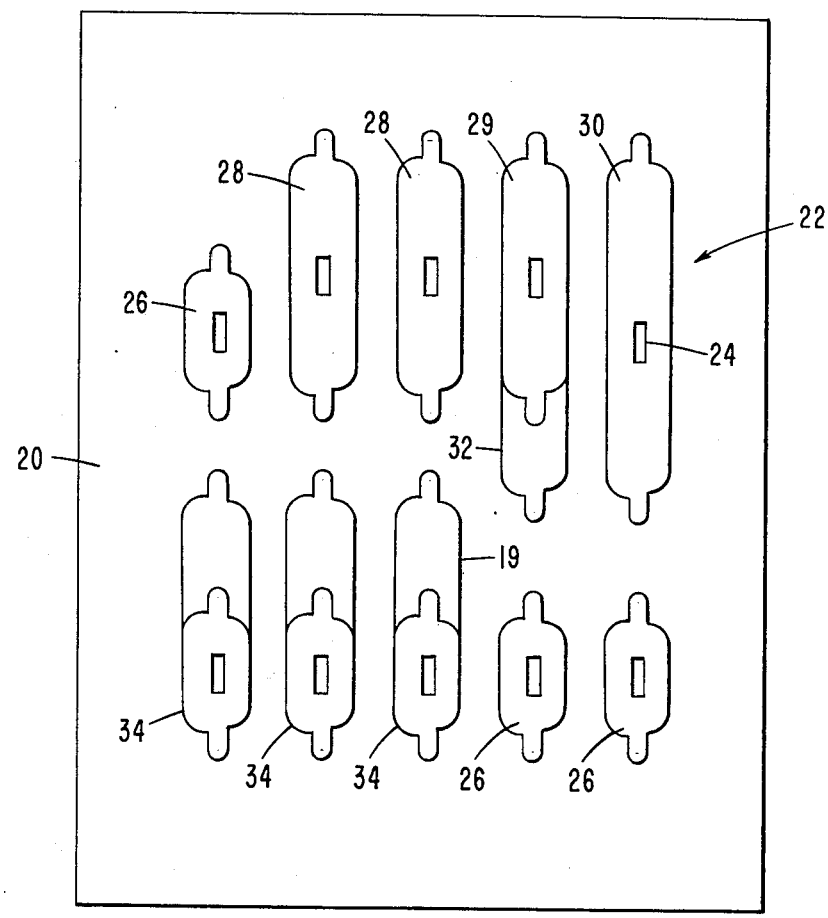
FIG. 3 is a front view of an electrical connector panel which is part of the terminal housing showing the different size knock-out plugs fabricated in accordance with the present invention.

Referring now to FIG. 1, there is shown a schematic representation of a data processing system including a data terminal device. As is well known in the art, the data terminal device 6 is connected to a control processing unit (CPU) 8 and functions to display on a display 10 and print data entered through a keyboard 9 located on the terminal device or received from a peripheral device such as a scanner 12 or a card reader 14. These peripheral devices are connected to the terminal device through electrical cables 16 (FIGS. 1 and 2) each of which terminates in an electrical connector 18 mounted within an aperture 19 (FIGS. 2 and 3) located in an electrical connector panel 20 forming part of the housing of the terminal device 6. As best shown in FIG. 3, the aperture 19 in the connector panel 20 is normally occupied by removable knock-out plugs generally indicated by the numeral 22 in FIG. 3. The knock-out plugs 22 may be removed by insertion of a screwdriver within a slot 24 in a manner that is well known in the art. As shown in FIG. 3, the sizes of the knock-out plugs vary to accommodate various sizes of electrical connectors that may be required to be mounted to the terminal device. The size of the electrical connector depends on the number of wires 25 (FIG. 2) contained in the cable 16 which is associated with a peripheral device and which is to be connected to the terminal device. As shown in FIG. 3, there are three different size knock-out plugs represented by the numerals 26, 28 and 30 in the present embodiment. While the plugs are shown to have the same general overall configuration, it is obvious that any configuration of plug can be accommodated in the present invention.

At the time the terminal device 6 is assembled, only those knock-out plugs required to accommodate the peripheral devices ordered by the customer are provided in the panel 20. As previously pointed out, in the past, to add peripheral devices such as the scale 31 (FIG. 1) to the terminal device once the terminal device had been sent to the customer required that a new aperture corresponding to one of the apertures shown in FIG. 3 be made, which became very expensive to accomplish. In order to overcome this problem, additional knock-out plugs were provided at the time the terminal device was constructed but their addition increased the size of the panel 20. In some instances, the panel size was limited due to the configuration of the data terminal device, thus limiting the number of knock-out plugs that could be provided to the customer.

In order to overcome this problem, multiple size knock-out plugs 32 and 34 (FIG. 3), each of which can accommodate two different sizes of electrical connectors, have been constructed. This arrangement allows the mounting of a number of different size connectors 18 without increasing the size of the electrical panel 20.

Figure 4:
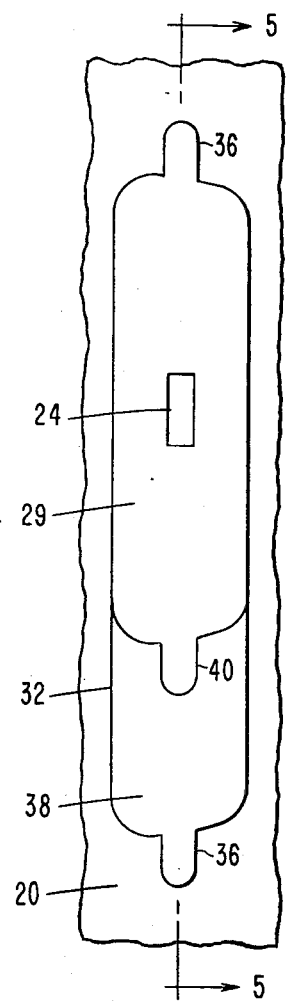
FIG. 4 is an enlarged view of one of the knock-out plugs shown in FIG. 3.
Figure 5:
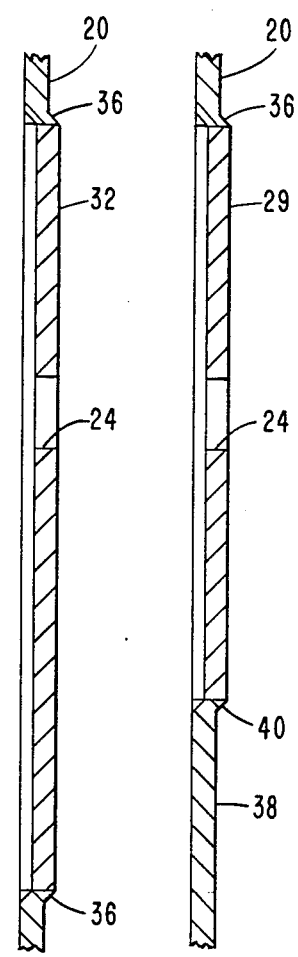
FIG. 5 is a sectional view of one of the knock-out plugs shown in FIG. 4 taken along the section line 5—5, illustrating one of the steps in the fabrication of the knock-out plug.
Figure 6:
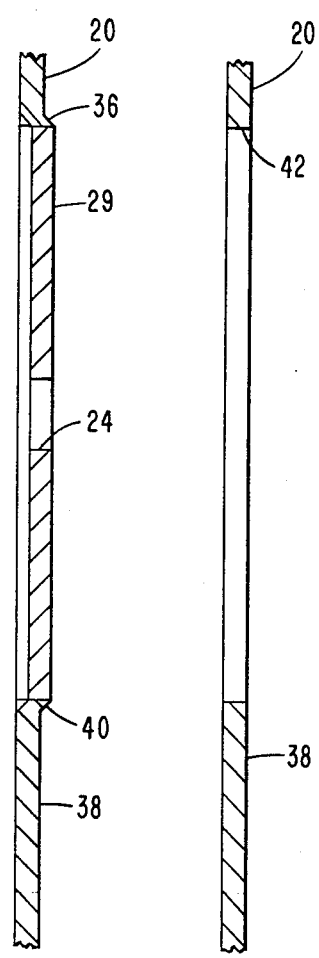
FIG. 6 is a sectional view of the knock-out plug shown in FIG. 2 taken along the section line 5—5 illustrating another step in the fabrication of the knock-out plug.

As shown in FIG. 4, the knock-out plug 32 provides mounting apertures corresponding to the knock-out plugs 28 and 30 (FIG. 3). In manufacturing the knock-out plugs 32 and 34, a die corresponding to the outer dimensions of the particular knock-out plug 32 or 34 is applied to the sheet metal panel 20, forming a perimetric line of weakness which punches out the knock-out plug to a raised position as shown in FIG. 5. The die will also punch out the slot 24 during this operation. The raised knock-out plug 32 is connected to the surface of the panel 20 by tab or uncut portions 36 (FIG. 5). A second die member conforming to the configuration of the lower portion 38 of the knock-out plug 32 is then applied to the raised plug 32 which returns the lower portion 38 to its original position within the plane of the panel 20 thereby leaving the raised upper portion 29 connected to the lower portion 38 of the plug by the tab portion 40 (FIG. 6). Since the knock-out plug 32 will expand when punched to its raised position (FIG. 5), the lower portion 38 of the knock-out plug 32 is tightly retained by the panel 20 when stamped back flush with the panel. This mounting of the lower portion 38 within the panel provides a mounting surface for the tab 40 and the knock-out plug 28.

Figure 7:
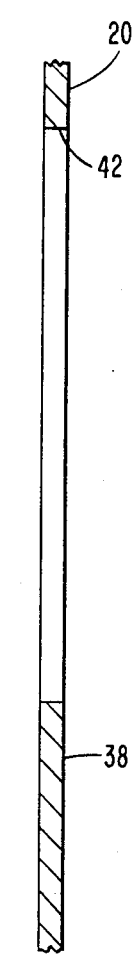
FIG. 7 is a sectional view similar to FIG. 6 with one of the sections of the knock-out plug removed.

To remove the upper portion 29, of the knock-out plug 32 corresponding to the knock-out plug 28 (FIG. 3), a screwdriver or other type of pointed instrument is inserted within the slot 24 so as to pry out the portion 29 from engagement with the lower portion 38 of the plug 32 and the panel 20. To remove the lower portion 38 of the plug 32, the portion 38 is grasped by a pair of pliers which has been inserted through the hole 42 (FIG. 7) provided by the removal of the portion 29. The pliers are then rotated to separate the lower portion 38 from the panel 20.

From the foregoing, it can be seen that the invention permits electrical connectors of various sizes to be mounted to a connector panel by the customer without requiring additional mounting space on the electrical panel.

While the invention has been described in this preferred embodiment, it is to be understood that the words which have been used are words of description rather than limitation, and that changes in construction may be made within the purview of the appended claims without departing from the true scope and spirit of the invention in its broader aspects.

What is claimed is:

1. In a data terminal housing member, a panel member for mounting different size electrical connectors whose longitudinal axes are located in the same vertical plane in the panel member including:

a first severable panel portion forming a first knock-out plug mounted in an interference fit with the panel member and flush with the surface of the panel member having a configuration of a first portion of a first elongated electrical connector formed by a line of weakening within the surface of the panel member; and a second severable panel portion having a width equal to the width of said first severable panel portion and extending to a raised position adjacent the surface of the first panel portion forming a second knock-out plug located adjacent to and contiguous with the first knock-out plug, said second knock-out plug having a configuration corresponding to a second elongated electrical connector together with the remaining portion of the first electrical connector whereby upon removal of the second knock-out plug, there is provided a first aperture in the panel member having a width which accommodates the mounting of the second electrical connector in the panel member and upon the removal of the first and second knock-out plugs, there is provided a second aperture in the panel member having the same width as the first aperture which accommodates the mounting of the first electrical connector.

2. The panel member of claim 1 in which said second knock-out plug includes a pair of first uncut portions connected to the first knock-out plug and to the panel member for mounting the second knock-out plug to the panel member.

3. The panel member of claim 1 in which said first knock-out plug includes a second uncut portion connected to the panel member enabling the first knock-out plug to be removed from the panel member after the second knock-out plug has been removed to provide an aperture in the panel which accommodates a mounting of the first electrical connector.

4. The panel member of claim 3 in which the second knock-out plug includes a slotted portion enabling the second knock-out plug to be removed from the panel member thereby providing an aperture in the panel member adjacent the first knock-out plug enabling the first knock-out plug to be removed from the panel member.

5. In a data terminal housing member, a panel member forming a portion of the housing member for mounting different size equal width electrical connectors in the same vertical position with respect to the housing member including:

a first severable generally rectangular panel portion forming a first knock-out plug mounted in an interference fit with the panel member and flush with the surface of the panel member, said first panel portion having a line of weakening forming the configuration of a portion of the engaging surface of a first elongated electrical connector and including a first uncut portion connected between one end of the first severable panel portion and the panel member enabling the first panel portion to be removed from the panel member; and a second severable generally rectangular panel portion forming a second knock-out plug orientated in a raised position with respect to the surface of the panel member and said first severable panel portion and contiguous to the top portion of the first severable panel portion, said second severable panel portion having the same width as the first severable panel portion and having a line of weakening forming the configuration of the engaging surface of a second elongated electrical connector and the remaining portion of the engaging surface of the first electrical connector whereby upon removal of the second knock-out plug, there is provided a first aperture in the panel member which accommodates the mounting of the second electrical connector in the panel member and upon the removal of the first and second knock-out plugs, there is provided a second aperture in the panel member which accommodates the mounting of the first electrical connector, said second severable panel portion including a second uncut connecting portion between the second panel portion and the panel member and a third uncut connecting portion between the second panel portion and the first panel portion for mounting the second panel portion thereto.

* * * * *